United States Patent
Yamashita et al.

(10) Patent No.: US 9,033,207 B2
(45) Date of Patent: May 19, 2015

(54) METHOD OF MANUFACTURING ELECTRONIC COMPONENT UNIT

(71) Applicant: Honda Elesys Co., Ltd., Yokohama (JP)

(72) Inventors: Seiji Yamashita, Kanagawa (JP); Tamotsu Teshima, Kanagawa (JP); Amane Murao, Kanagawa (JP); Hiroshi Ishizaki, Kanagawa (JP); Takashi Honda, Kanagawa (JP); Hitoshi Kuroyanagi, Kanagawa (JP); Tomoyuki Masubuchi, Kanagawa (JP)

(73) Assignee: HONDA ELESYS CO., LTD., Yokohama (JP)

( * ) Notice: Subject to any disclaimer, the term of this patent is extended or adjusted under 35 U.S.C. 154(b) by 0 days.

(21) Appl. No.: 14/260,969

(22) Filed: Apr. 24, 2014

(65) Prior Publication Data
US 2014/0231491 A1    Aug. 21, 2014

Related U.S. Application Data

(62) Division of application No. 12/929,704, filed on Feb. 9, 2011, now Pat. No. 8,737,075.

(30) Foreign Application Priority Data

Feb. 9, 2010  (JP) .................................. 2010-026587

(51) Int. Cl.
*B23K 31/02* (2006.01)
*H05K 7/20* (2006.01)
(Continued)

(52) U.S. Cl.
CPC ........ *H05K 7/20509* (2013.01); *B23K 2201/42* (2013.01); *B23K 1/0016* (2013.01); *B23K 37/003* (2013.01); *H05K 7/20472* (2013.01);
(Continued)

(58) Field of Classification Search
None
See application file for complete search history.

(56) References Cited

U.S. PATENT DOCUMENTS

| 4,034,468 A | * | 7/1977 | Koopman | ........................ 29/825 |
| 4,955,132 A | * | 9/1990 | Ozawa | ............................. 29/840 |

(Continued)

FOREIGN PATENT DOCUMENTS

| JP | 57-50455 | 3/1982 |
| JP | 07-161925 | 6/1995 |

(Continued)

OTHER PUBLICATIONS

Japanese Office Action mailed Dec. 10, 2013 in corresponding Japanese Application No. 2010-026587.

(Continued)

*Primary Examiner* — Kiley Stoner (57) ABSTRACT

An electronic component unit manufacturing method includes: preparing a circuit board including a heat generating element mounted thereon and a bonding metal foil layer formed thereon, a heat transfer board including an insulative layer formed on one face thereof and a heat transfer metal foil layer formed on the insulative layer, and a heat sink; applying a cream solder to form a solder layer on the board bonding metal foil layer or the heat transfer metal foil layer; superimposing the bonding metal foil layer and the heat transfer metal foil layer with each other via the solder layer; re-melting the solder layer to solder the bonding metal foil layer and the heat transfer metal foil layer; and superimposing the other face of the heat transfer board with the heat sink to thereby assemble the circuit board with the heat sink via the heat transfer board.

9 Claims, 9 Drawing Sheets

(51) Int. Cl.
    *B23K 1/00*     (2006.01)
    *B23K 37/00*     (2006.01)
    *H05K 13/04*     (2006.01)

(52) U.S. Cl.
    CPC .. *H05K 7/20854* (2013.01); *H01L 2224/32225* (2013.01); *H01L 2224/83385* (2013.01); *H01L 2924/15151* (2013.01); *H01L 2924/19105* (2013.01); *H05K 13/0465* (2013.01); *H05K 7/20* (2013.01)

(56) References Cited

U.S. PATENT DOCUMENTS

| | | | | |
|---|---|---|---|---|
| 5,395,679 | A * | 3/1995 | Myers et al. | 428/209 |
| 5,528,456 | A * | 6/1996 | Takahashi | 361/704 |
| 6,033,787 | A * | 3/2000 | Nagase et al. | 428/545 |
| 6,061,240 | A | 5/2000 | Butterbaugh et al. | 361/704 |
| 6,377,461 | B1 | 4/2002 | Ozmat et al. | 361/704 |
| 6,528,878 | B1 | 3/2003 | Daikoku et al. | 257/714 |
| 6,884,511 | B1 * | 4/2005 | Rossing et al. | 428/446 |
| 7,038,313 | B2 | 5/2006 | Mochizuki et al. | 257/713 |
| 7,099,155 | B2 | 8/2006 | Kobayashi et al. | 361/719 |
| 7,190,581 | B1 * | 3/2007 | Hassani et al. | 361/699 |
| 7,323,255 | B2 | 1/2008 | Tanaka et al. | 428/615 |
| 7,800,917 | B2 | 9/2010 | Shimada et al. | 361/795 |
| 8,299,606 | B2 | 10/2012 | Mori et al. | 251/706 |
| 2002/0089828 | A1 * | 7/2002 | Suzuki et al. | 361/709 |
| 2003/0117776 | A1 | 6/2003 | Katsuro et al. | 361/705 |
| 2006/0191707 | A1 | 8/2006 | Ishikawa et al. | 174/250 |
| 2007/0284731 | A1 * | 12/2007 | Atsumi et al. | 257/706 |
| 2008/0186682 | A1 | 8/2008 | Sugimura | 361/720 |
| 2008/0278918 | A1 | 11/2008 | Tominaga et al. | 361/719 |
| 2008/0291636 | A1 | 11/2008 | Mori et al. | 361/709 |
| 2008/0310131 | A1 | 12/2008 | Fino et al. | 361/758 |
| 2008/0315401 | A1 * | 12/2008 | Imamura et al. | 257/712 |
| 2009/0086455 | A1 | 4/2009 | Sakamoto et al. | 361/796 |
| 2009/0213550 | A1 * | 8/2009 | Hongo | 361/704 |
| 2010/0171213 | A1 * | 7/2010 | Hisano et al. | 257/714 |
| 2010/0193941 | A1 * | 8/2010 | Mori et al. | 257/712 |
| 2010/0200290 | A1 | 8/2010 | Tokunaga et al. | 174/548 |
| 2010/0226102 | A1 * | 9/2010 | So et al. | 361/748 |
| 2010/0245024 | A1 | 9/2010 | Furuuchi et al. | 337/283 |
| 2010/0327431 | A1 * | 12/2010 | Touzelbaev et al. | 257/712 |
| 2011/0005810 | A1 * | 1/2011 | Uneno et al. | 174/252 |
| 2011/0075376 | A1 * | 3/2011 | Itoh | 361/707 |
| 2011/0079902 | A1 * | 4/2011 | Sakamoto et al. | 257/738 |
| 2013/0328204 | A1 * | 12/2013 | Zommer | 257/765 |

FOREIGN PATENT DOCUMENTS

| | | |
|---|---|---|
| JP | 2005-72104 | 3/2005 |
| JP | 3128955 | 1/2007 |

OTHER PUBLICATIONS

Restriction Requirement mailed from the United States Patent and Trademark Office on Dec. 20, 2012 in the related U.S. Appl. No. 12/929,704.

Office Action mailed from the United Stated Patent and Trademark Office on May 7, 2013 in the related U.S. Appl. No. 12/929,704.

Office Action mailed from the United Stated Patent and Trademark Office on Sep. 12, 2013 in the related U.S. Appl. No. 12/929,704.

Notice of Allowance mailed from the United States Patent and Trademark Office on Jan. 14, 2014 in the related U.S. Appl. No. 12/929,704.

U.S. Appl. No. 12/929,704, filed Feb. 9, 2011, Seiji Yamashita et al., Honda Elesys Co., Ltd.

* cited by examiner

METHOD OF MANUFACTURING ELECTRONIC COMPONENT UNIT

CROSS-REFERENCE TO RELATED APPLICATION(S)

This application is a divisional of and claims priority benefit to U.S. patent application Ser. No. 12/929,704, filed Feb. 9, 2011, allowed, which application in turn is based upon and claims the foreign priority benefit of prior Japanese Patent Application No. 2010-026587, filed Feb. 9, 2010, the entire contents of which are incorporated herein by reference.

BACKGROUND

1. Field

Embodiments described herein relate to an electronic component unit having a heat sink for external dissipation of heat from an electronic component (heat generating element) that generates a large amount of heat due to a large current, and a manufacturing method thereof.

2. Description of the Related Art

In an electronic component unit, various types of electronic component including heat generating elements are included. Examples of heat generating elements are semiconductor switching elements, such as power field effect transistors (FETs), and shunt resistors. Power FETs may be used to control drive current in motors. In order to efficiently dissipate heat generated by the heat generating elements so as to be within their permitted temperature ranges, for example, a heat sink is provided. For example, in JP-H07-161925-A and JP-UM-3128955-B, a heat sink is employed for external dissipation of heat transferred from the heat generating elements to a circuit board.

In the electronic component unit of JP-H07-161925-A, a metal base board and a circuit board are separately attached to a heat dissipation case (corresponding to a heat sink). Heat generating elements are mounted to the metal base board via an insulating layer, and other electronic components are mounted to the circuit board. However, in JP-H07-161925-A, wiring leads for electrical connection between the metal base board and the circuit board are required, thereby increasing the number of constituent elements and the number of assembly processes.

In the electronic component unit of JP-UM-3128955-B, heat generating elements are mounted on a circuit board, and a tin layer is provided on the back face of the circuit board via a copper foil layer. A heat dissipation sheet (corresponding to a heat sink) is laminated on the tin layer, and fixed to the copper foil layer by melting the tin layer in a reflow oven. In JP-UM-3128955-B, the circuit board and the heat dissipation sheet should be electrically insulated. When an insulative member is simply interposed between the circuit board and the heat dissipation sheet, the number of constituent elements and the number of assembly processes will be increased.

SUMMARY

Embodiments described herein provide an electronic component unit capable of efficiently dissipating heat generated by a heat generating element, while reducing the number of constituent elements and the number of assembly processes, and a manufacturing method thereof.

According to a first aspect of the embodiments, there is provided an electronic component unit, including: a circuit board including: electronic components mounted on the circuit board, the electronic components including a heat generating element that generates a heat; and a bonding metal foil layer formed on a face of the circuit board; a heat transfer board including: a board body having a thermal conductivity higher than that of the circuit board, the board body having a first face and a second face opposite to the first face; an insulative layer formed on the first face; and a heat transfer metal foil layer formed to cover the insulative layer on the first face; and a heat sink configured to externally dissipate the heat generated in the heat generating element, wherein the circuit board is assembled with the heat sink via the heat transfer board such that (1) the heat transfer metal foil layer on the first face of the board body is soldered to the bonding metal foil layer on the circuit board and (2) the second face of the board body is superimposed on the heat sink.

According to a second aspect of the embodiments, there may be provided the electronic component unit, wherein the board body is a metal flat plate, wherein the insulative layer is an insulative covering film printed on the first face of the flat plate, and wherein the heat transfer metal foil layer is a copper foil layer printed to cover the covering film.

According to a third aspect of the embodiments, there may be provided the electronic component unit, wherein the bonding metal foil layer includes a circuit pattern for the heat generating element, wherein the heat transfer metal foil layer has a pattern similar to the circuit pattern, and wherein both the patterns are electrically connected to each other.

According to a fourth aspect of the embodiments, there may be provided the electronic component unit, wherein the circuit board has a through hole therein at a mounting area for mounting the heat generating element, and wherein a solder is filled in the through hole so as to be connected with the bonding metal foil layer.

According to a fifth aspect of the embodiments, there may be provided the electronic component unit, wherein the circuit board has a plurality of mounting areas for respectively mounting a plurality of heat generating elements, wherein the heat transfer board is divided so as to each correspond to a respective one of the plurality of mounting areas.

According to a sixth aspect of the embodiments, there is provided an electronic component unit manufacturing method, including: preparing: a circuit board including a heat generating element mounted thereon and a bonding metal foil layer formed thereon; a heat transfer board including an insulative layer formed on one face thereof and a heat transfer metal foil layer formed on the insulative layer; and a heat sink; applying a cream solder to form a solder layer on the board bonding metal foil layer or the heat transfer metal foil layer; superimposing the bonding metal foil layer and the heat transfer metal foil layer with each other via the solder layer; re-melting the solder layer to solder the bonding metal foil layer and the heat transfer metal foil layer; and superimposing the other face of the heat transfer board with the heat sink to thereby assemble the circuit board with the heat sink via the heat transfer board.

In the first aspect, the heat transfer board is interposed between the circuit board and the heat sink. The heat transfer board has the metal foil layer for heat transfer formed on the first face of the higher thermal conductivity board body, with the insulative layer interposed therebetween. The circuit board and the heat sink can be assembled into a single unit by bonding the heat transfer metal foil layer to the metal foil layer formed on the circuit board by solder, and superimposing and assembling the second face of the board body to the heat sink.

Since both the heat generating element and the other electronic components can be mounted to the circuit board, no wiring components are required for connecting the heat generating element to the other electronic components. Furthermore, since the first face of the board body has the insulative layer, there is no need for a separate component (such as an insulation sheet) to electrically insulate between the circuit board and the heat sink. Consequently, while reducing the number of constituent elements, the number of assembly processes can also be reduced. Since the heat transfer board is interposed between the circuit board and the heat sink, heat generated by the heat generating element can be efficiently externally dissipated with a simple construction by simply bonding the circuit board and the heat transfer board with solder.

In the second aspect, the heat transfer board is an integrated component in which the copper foil layer formed on the first face of the metal flat plate via the insulative covering film. Since the heat transfer board having the metal flat plate as a central member is fixed to the circuit board, the circuit board can be reinforced. As a result, the bending rigidity of the circuit board can be increased. Consequently, the circuit board and the heat transfer board can be closely bonded to the heat sink, further increasing the heat dissipation effect from the circuit board to the heat sink through the heat transfer board.

In the third aspect, the heat transfer metal foil layer is formed on the circuit board with a pattern similar to the circuit pattern for the heat generating element. Both these patterns are electrically connected to each other. Hence current supplied to the heat generating element can flow through both of the circuit pattern formed on the circuit board and the pattern of the heat transfer metal foil layer. Since the electrical conducting capacity of the circuit pattern formed on the circuit board can be reduced, the thickness and/or width of the circuit pattern can be made smaller. Furthermore, since electricity is conducted to the heat generating element by both patterns, an even larger capacity heat generating element can be mounted to the circuit board.

In the fourth aspect the circuit board includes the through hole in the mounting area for mounting the heat generating element, and solder is filled in the through hole so as to be connected with the circuit board bonding metal foil layer. Accordingly, heat generated by the heat generating element can be efficiently transferred to the heat transfer board through the solder filled in the through hole, and then transferred onward to the heat sink. Consequently, the heat dissipation effect can be increased even higher.

In the fifth aspect, the circuit board includes plural mounting areas for mounting the plural heat generating elements. The heat transfer board is divided correspondingly with the plural mounting areas. Consequently, efficient heat dissipation effect is obtained while minimizing the use of the relatively high cost heat transfer boards.

In the sixth aspect, the solder layer is formed on one of the metal foil layers by applying a cream solder, and the two metal foil layers are solder bonded to each other by superimposing both of the metal foil layers on each other via the solder layer, and then re-melting the solder layer. Thus, the heat transfer board is integrated to the circuit board. Since the heat transfer metal foil layer is formed on the one face of the heat transfer board via the insulative layer, a separate component (such as an insulating sheet) is not required for electrically insulating between the circuit board and the heat transfer board. Consequently, while reducing the number of constituent elements, the number of assembly processes can also be reduced.

The other face of the heat transfer board is then superimposed and assembled to the heat sink. The heat transfer board is thereby interposed between the circuit board and the heat sink, and the three components can thereby be assembled as a single unit. Accordingly, heat generated by the heat generating element can be efficiently externally dissipated by simply interposing the heat transfer board between the circuit board and the heat sink and bonding the circuit board and the heat transfer board together with solder.

Furthermore, since both the heat generating element and the other electronic components can be mounted to the circuit board, no wiring components are required for connecting the heat generating element to the other electronic components. Consequently, while reducing the number of constituent elements, the number of assembly processes can also be reduced.

DESCRIPTION OF EMBODIMENTS

Embodiments will be described, with reference to the attached drawings.

First Embodiment

Figure 1:
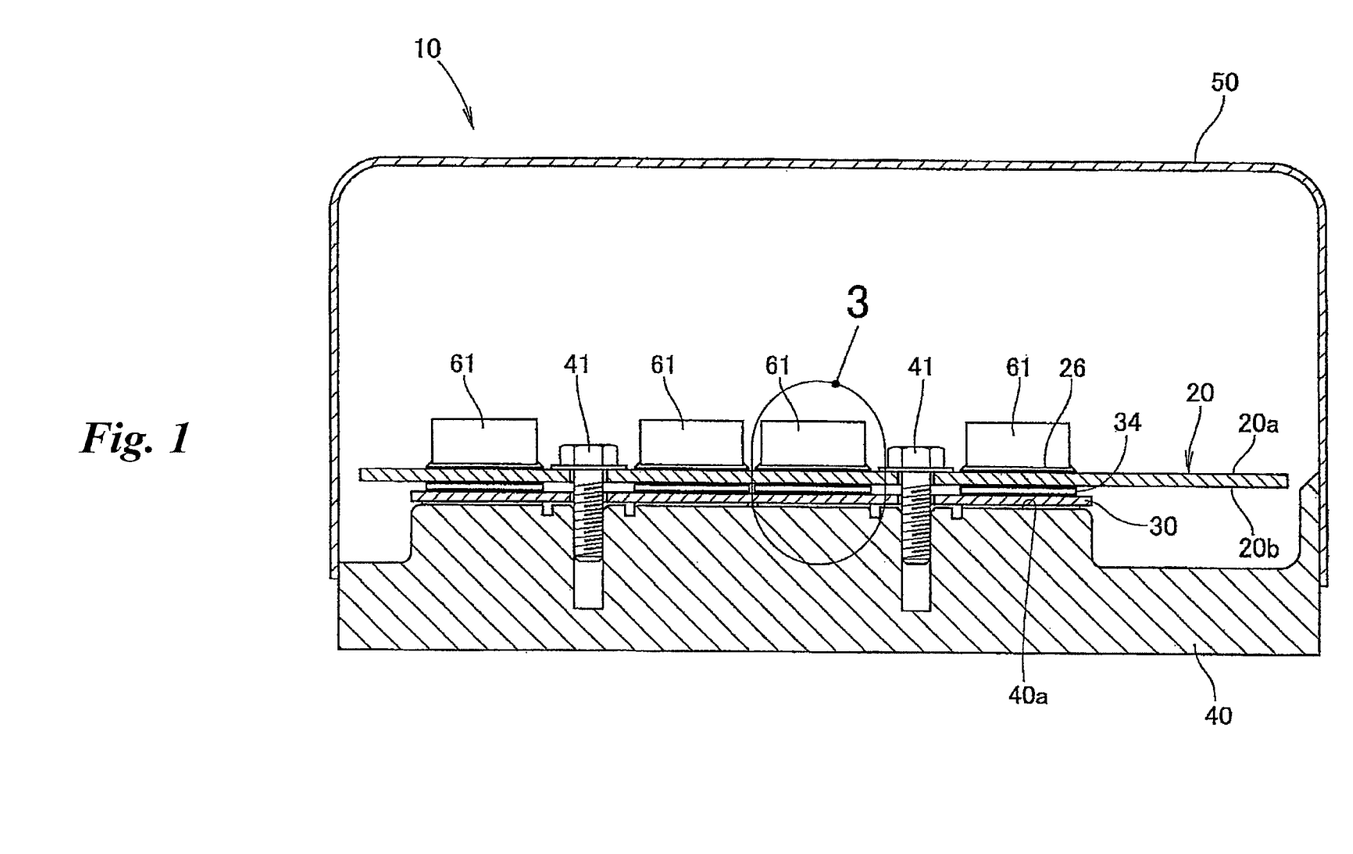
FIG. 1 cross-sectionally illustrates an electronic component unit according to a first Embodiment.
Figure 2:
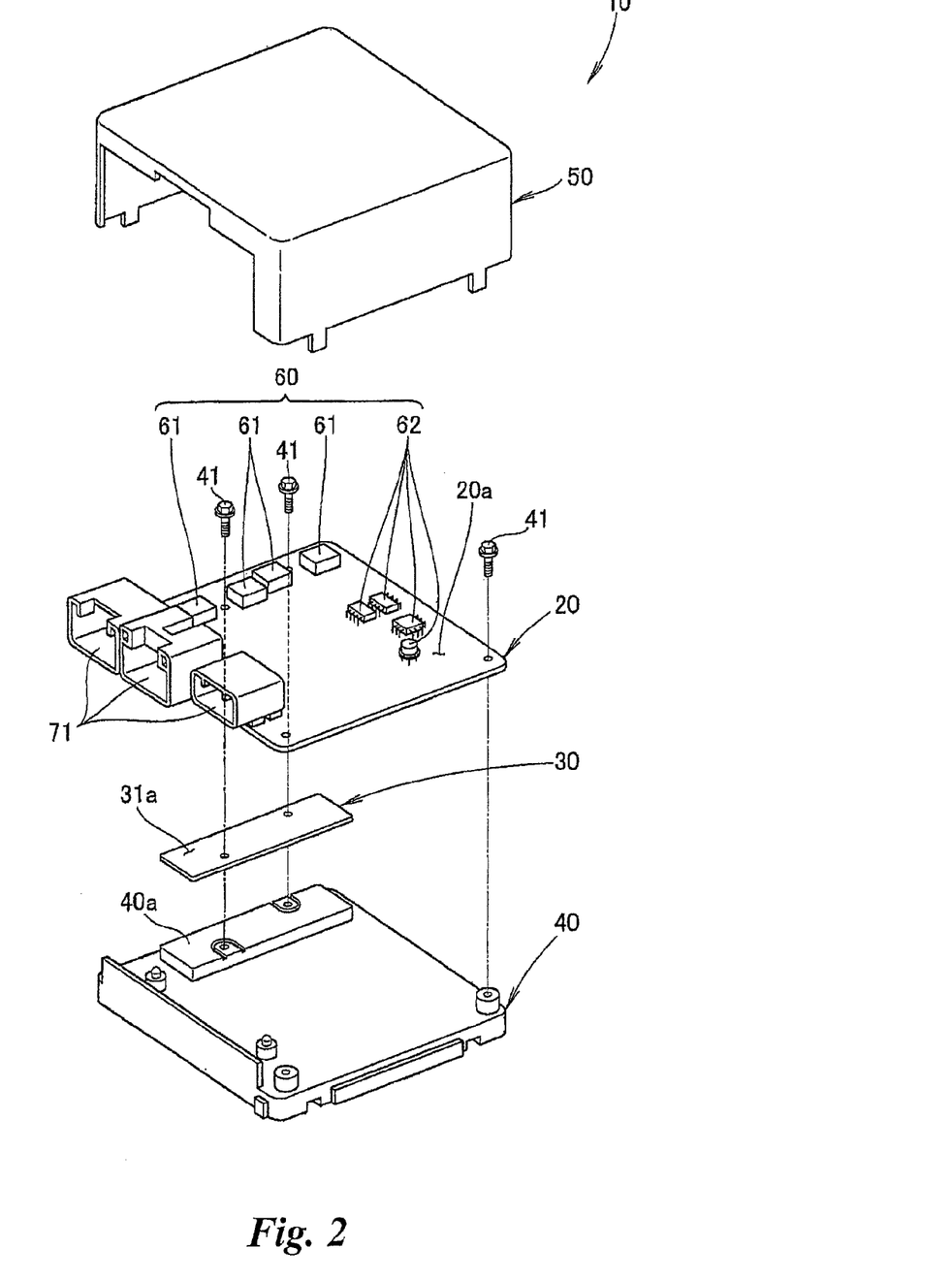
FIG. 2 is an exploded diagram of the electronic component unit illustrated in FIG. 1.

An electronic component unit according to a first Embodiment will be described, with reference to FIG. 1 to FIG. 5. As shown in FIG. 1 and FIG. 2, an electronic component unit 10 of the first Embodiment includes a circuit board 20, a heat transfer board 30, a heat sink 40 and a cover 50.

The circuit board 20 is a flat board formed of an insulative resin material, such as an epoxy resin. On the circuit board 20, electrical components 60 and connectors 71 are provided. The electrical components 60 include heat generating elements 61 and other elements 62. According to the Embodiments, as the electrical components 60, at least one heat generating element 61 is attached to the circuit board 20 by surface mounting.

For example, the "heat generating elements" 61 include a semiconductor switch element and a shunt resistor in which a comparatively large amount of heat is generated due to a large current. An example of the semiconductor switch element is a power FET. For example, the power FET may be used to drive a motor in an electrical power assisted steering system. For example, the other elements 62 include a capacitor.

"Surface mounting" is a method for attaching/mounting an electronic component to a circuit board by directly soldering the electronic component to the surface of the circuit board. According to the surface mounting, mounting density can be increased as compared with a method in which leads of electronic components are fixed into holes in a circuit board.

Specifically, in the "surface mounting", a cream solder is first printed onto a base board at positions for mounting electronic components. Electronic components are then mounted at the mounting positions using a chip mounter. The base board mounted with the electronic components is then placed in a reflow oven, so as to melt the solder with heat (a reflow process) to thereby fix the electronic components to the base board.

Figure 3:
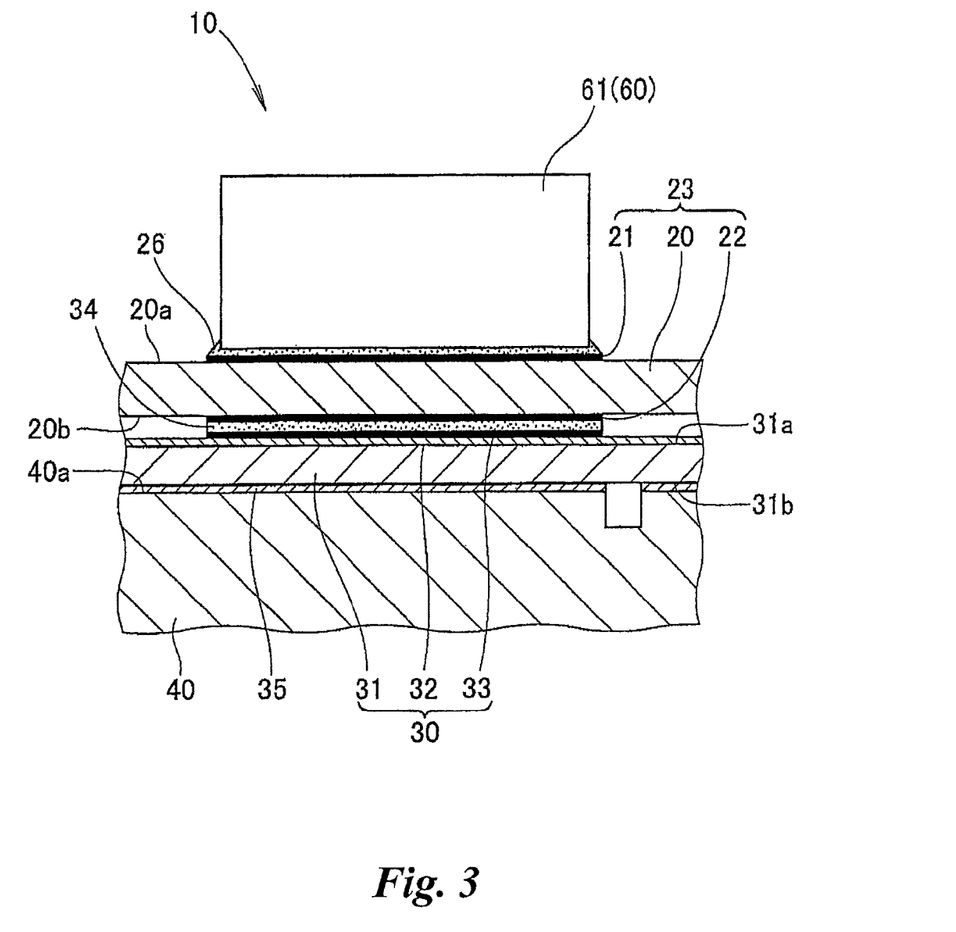
FIG. 3 enlargedly illustrates the portion 3 in FIG. 1.

In this embodiment, as shown in FIG. 3, a so-called double sided board (two-layer board) is used as the circuit board 20, and metal foil layers 21, 22 are formed on either face of the circuit board 20. In the circuit board 20, the first metal foil layer 21 is formed on a first board face 20a, and the second metal foil layer 22 is formed on a second board face 20b. The second board face 20b faces the heat transfer board 30, and the first board face 20a is opposite to the heat transfer board 30. The circuit board 20 and the first and second metal foil layers 21, 22 form a laminated structure 23. The circuit board 20 is not limited to a two-layer board, but may be any multilayer board.

Figure 4A:
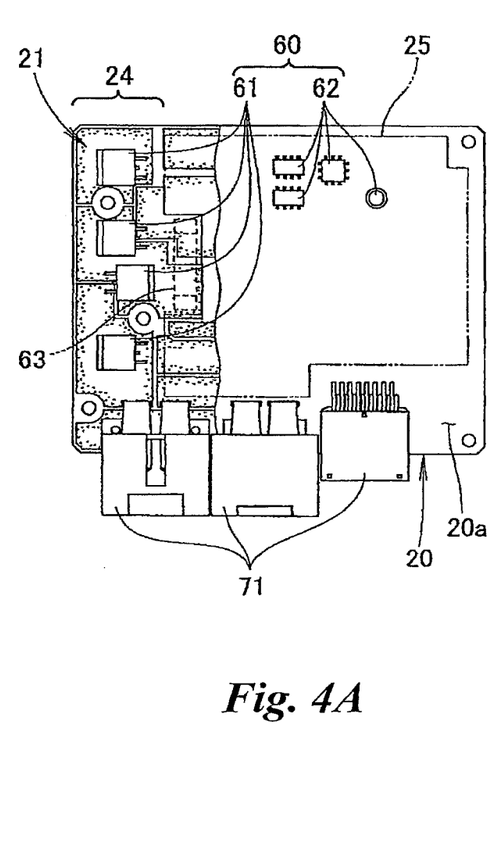
FIG. 4A to 4C illustrate each of the circuit patterns of the circuit board and the heat transfer board in FIG. 2, and a layout for component mounting to the circuit board.
Figure 4B:
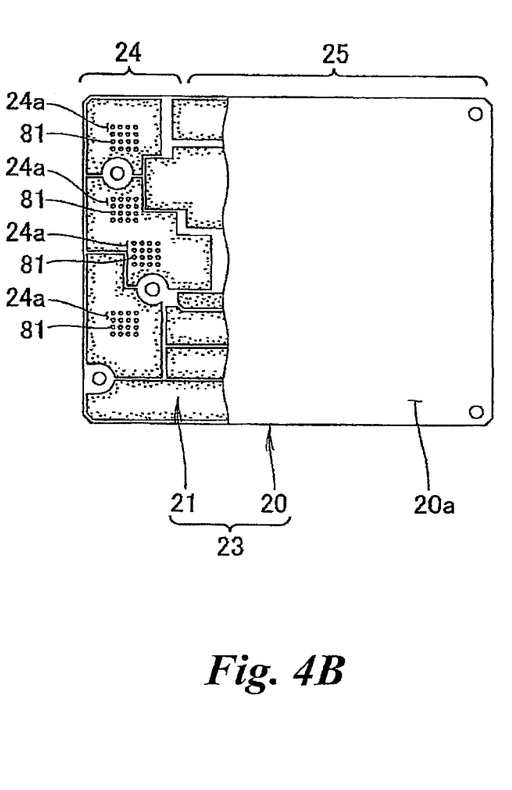
Figure 4C:
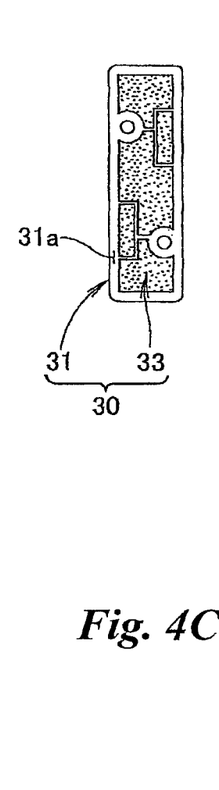

FIG. 4A shows the circuit board 20 on which the electrical components 60 and the connectors 71 are mounted, as viewed from the first board face 20a side. FIG. 4B shows the circuit board 20 alone, as viewed from the first board face 20a side. FIG. 4C shows the heat transfer board 30, as viewed from a first board face 31a side.

Figure 5:
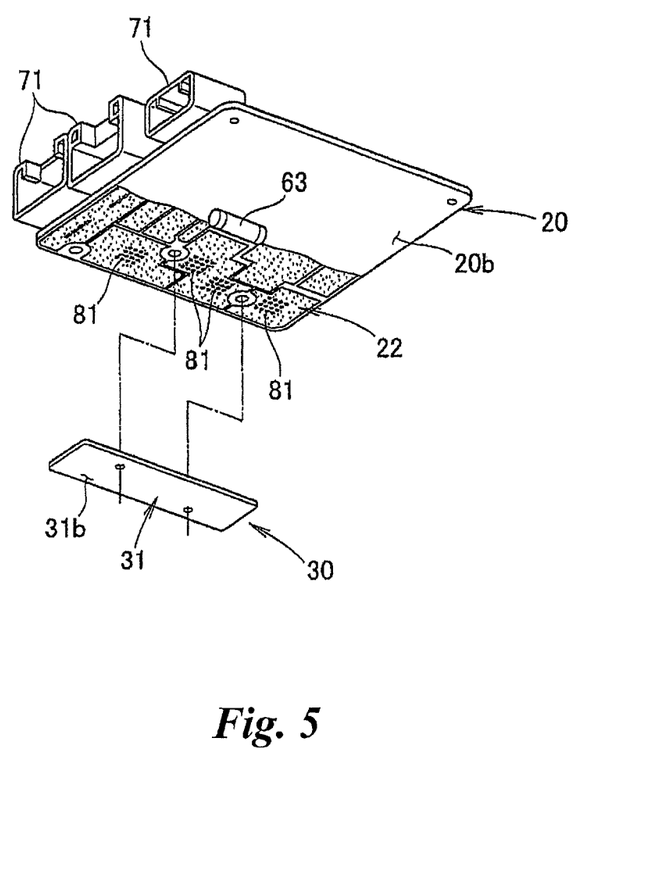
FIG. 5 is an exploded diagram of the circuit board and the heat transfer board in FIG. 2, as viewed from the heat transfer board side.

As shown in FIG. 4A, 4B and FIG. 5, the first and second metal foil layers 21, 22 are shaped into thin film. The first and second metal foil layers 21, 22 are printed on the circuit board 20 to have specific circuit patterns. The laminated structure 23 (the first metal foil layer 21, the circuit board 20 and the second metal foil layer 22) is partitioned into a first area 24 and a second area 25. The heat generating elements 61 are mounted on the first area 24 of the first metal foil layer (first circuit pattern layer) 21, and the other elements 62 are mounted on the second area 25 of the first metal foil layer (first circuit pattern layer) 21. The second metal foil layer (second circuit pattern layer) 22 is employed for bonding to the heat transfer board 30.

As shown in FIGS. 4A and 4B, the first area 24 of the first circuit pattern layer 21 includes mounting areas 24a for mounting the respective heat generating elements 61. The heat generating elements 61 are surface mounted at the respective mounting areas 24a so as to be electrically connected to the first circuit pattern layer 21. Specifically, as shown in FIG. 3, a first solder layer 26 is formed on the first circuit pattern layer 21 by printing, and the heat generating elements 61 are surface mounted to the first circuit pattern layer 21 by re-melting the first solder layer 26. The other elements 62 are also mounted to the first circuit pattern layer 21 through the first solder layer 26.

As shown in FIG. 4A, holes are formed in the circuit board 20 at the second area 25. The other elements 62 are electrically connected to the first circuit pattern layer 21 by inserting leads of the other elements 62 into the holes in the circuit board 20 and soldering.

As shown in FIG. 5, at the first area 24, the second circuit pattern layer 22 is formed so as to correspond to the first circuit pattern layer 21 (see FIG. 4B). Namely, the second circuit pattern layer 22 is formed with substantially the same pattern as the first circuit pattern layer 21 within the first area 24.

As shown in FIG. 3 and FIG. 5, the heat transfer board 30 overlaps at least partially with the second circuit pattern layer 22 on the circuit board 20. The heat transfer board 30 includes a board body 31, an insulative layer 32 and a metal foil layer 33. The insulative layer 32 is formed on the first board face 31a of the board body 31, and the metal foil layer 33 is formed on the top face (outside face) of the insulative layer 32 for heat transfer.

The board body 31 is formed of a material having a higher thermal conductivity than the circuit board 20. Specifically, the board body 31 is shaped into a flat plate and formed of a metallic material such as an aluminum or copper alloy. For example, at a temperature of 0° C., the thermal conductivity of aluminum is 236 W/mK, the thermal conductivity of copper is 403 W/mK, and the thermal conductivity of bisphenol A epoxy resin is 0.21 W/mK.

The heat transfer board 30 is generally referred to as a metal base board as it has the metallic board body 31. For example, when the board body 31 is formed of an aluminum alloy, the heat transfer board 30 may be referred to as an aluminum base board (aluminum board).

As shown in FIG. 3, the insulative layer 32 is a covering film formed by printing to cover substantially the entire first board face 31a of the board body 31. The insulative layer 32 has a thin film shape and formed of a material that is both electrical insulation property and high thermal conductivity, such as an epoxy resin. In order to increase heat dissipation ability while maintaining electrical insulation property, for example, the thickness of the insulative layer 32 is set in the range from 50 μm to 200 μm. When the insulative layer 32 is too thin, the electrical insulation property may be deteriorated, and when the insulative layer 32 is too thick, the heat dissipation ability may be suppressed low. It is preferable to use the insulative layer 32 having the high heat transfer ability to maintain the heat transfer ability to the heat transfer board 30 (to maintain good heat dissipation ability).

As shown in FIG. 3 and FIG. 4C, the heat transfer metal foil layer 33 is a thin film shaped conductive layer, and is disposed on the first board face 31a of the board body 31 via the insulative layer 32. The metal foil layer 33 is formed of a copper foil layer printed onto the top face of the covering film 32, and is formed to have a similar pattern to the second circuit pattern layer 22. The metal foil layer (third circuit pattern layer) 33 is provided for heat transfer, and no component is mounted to the metal foil layer 33.

The heat transfer metal foil layer (third circuit pattern layer) 33 of the heat transfer board 30 is bonded to the second metal foil layer (second circuit pattern layer) 22 of the laminated structure 23 by a second solder layer 34. The second solder layer 34 is formed to have a similar pattern to that of the second and third circuit pattern layers 22, 33. Thus, both the circuit pattern layers 22, 33 are electrically connected to each other through the second solder layer 34.

As shown in FIG. 1 to FIG. 3, the heat sink 40 is a heat dissipation plate for externally dissipating heat transferred to the circuit board 20 from the heat generating elements 61, and also serves as a base of the electronic component unit 10. The heat sink 40 is, for example, formed of an aluminum or copper alloy. A second board face 31b of the board body 31 (the board face 31b opposite to the circuit board 20) overlaps with a first face 40a of the heat sink 40 and is attached to the heat sink 40 by plural fitting members 41, such as screws or rivets.

As shown in FIG. 3, the second board face 31b of the heat transfer board 30 is preferably joined to the first face 40a of the heat sink 40 via a heat dissipation grease layer 35, such as a silicone grease. Heat transfer from the heat transfer board 30 to the heat sink 40 can be promoted by interposing the heat dissipation grease layer 35 therebetween.

The heat transfer board 30 and the laminated structure 23 (circuit board 20) are thus formed on top of heat sink 40 in this sequence, and fastened with the common fitting members 41 to thereby form a single unit. The laminated structure 23 (circuit board 20) and the heat transfer board 30 assembled to the heat sink 40 are covered by the cover 50.

The heat generated by at least the heat generating elements 61 is transferred to the heat sink 40 through the first solder layer 26, the first circuit pattern layer 21, the circuit board 20, the second metal foil layer (second circuit pattern layer) 22, the second solder layer 34, the heat transfer metal foil layer (third circuit pattern layer) 33, the insulative layer 32, the board body 31 and the heat dissipation grease layer 35. And, the transferred heat is then dissipated from the heat sink 40 to the atmosphere.

As shown in FIG. 5, the second circuit pattern layer 22 on the circuit board 20 has an area for mounting a heat generating element 63 (such as a shunt resistor) and an area for mounting other electronic components, at locations not overlapping with the heat transfer board 30. The heat generated by the heat generating element 63 is transferred to the heat sink 40 through the second metal foil layer (second circuit pattern layer) 22, the second solder layer 34, the heat transfer metal foil layer (third circuit pattern layer) 33, the insulative layer 32, the board body 31 and the heat dissipation grease layer 35. And, the transferred heat is then dissipated from the heat sink 40 to the atmosphere.

In the electronic component unit 10 according to the first embodiment, the heat transfer board 30 is interposed between the laminated structure 23 (circuit board 20) and the heat sink 40. The heat transfer board 30 includes the board body 31 of high thermal conductivity and the heat transfer metal foil layer 33 formed on the first board face 31*a* via the insulative layer 32. The laminated structure 23 (circuit board 20) and the heat sink 40 can be assembled into a single unit by bringing the second board face 31*b* of the board body 31 onto the first face 40*a* of the heat sink 40 and by soldering/bonding the heat transfer metal foil layer 33 of the heat transfer board 30 to the second metal foil layer 22 of the laminated structure 23.

Since both the heat generating elements 61 and the electrical components 60 can be mounted to circuit board 20, wiring for connecting the heat generating elements 61 and the other elements 62 is not required. Since the insulative layer 32 is provided to the first board face 31*a* of the board body 31, a separate component (such as an insulating sheet) is also not required for electrically insulating between the circuit board 20 and the heat sink 40. Consequently, both of the number of constituent elements and the number of assembly processes can be reduced. Further, a configuration for externally dissipating the heat generating elements 61 can be simply accomplished by interposing the heat transfer board 30 between the circuit board 20 and the heat sink 40, and by bonding the circuit board 20 and the heat transfer board 30 with solder.

The heat transfer board 30 is a single component in which the metal foil layer 33 is formed to the first board face 31*a* of the metal flat board 31 (board body 31) via the insulative covering film 32 (insulative layer 32). Since the metal flat board 31 as a main component of the heat transfer board 30 is fixed to the circuit board 20, the strength of the circuit board 20 can be increased by the heat transfer board 30. As a result, the bending rigidity of the circuit board 20 is increased. Consequently, the circuit board 20 and the heat transfer board 30 can be closely bonded to the heat sink 40, further increasing the heat dissipation effect from the circuit board 20 to the heat sink 40 through the heat transfer board 30.

The manufacturing method of the electronic component unit 10 of the first Embodiment will be described, with reference to FIG. 1 to FIG. 5, and FIG. 6.

Figure 6:
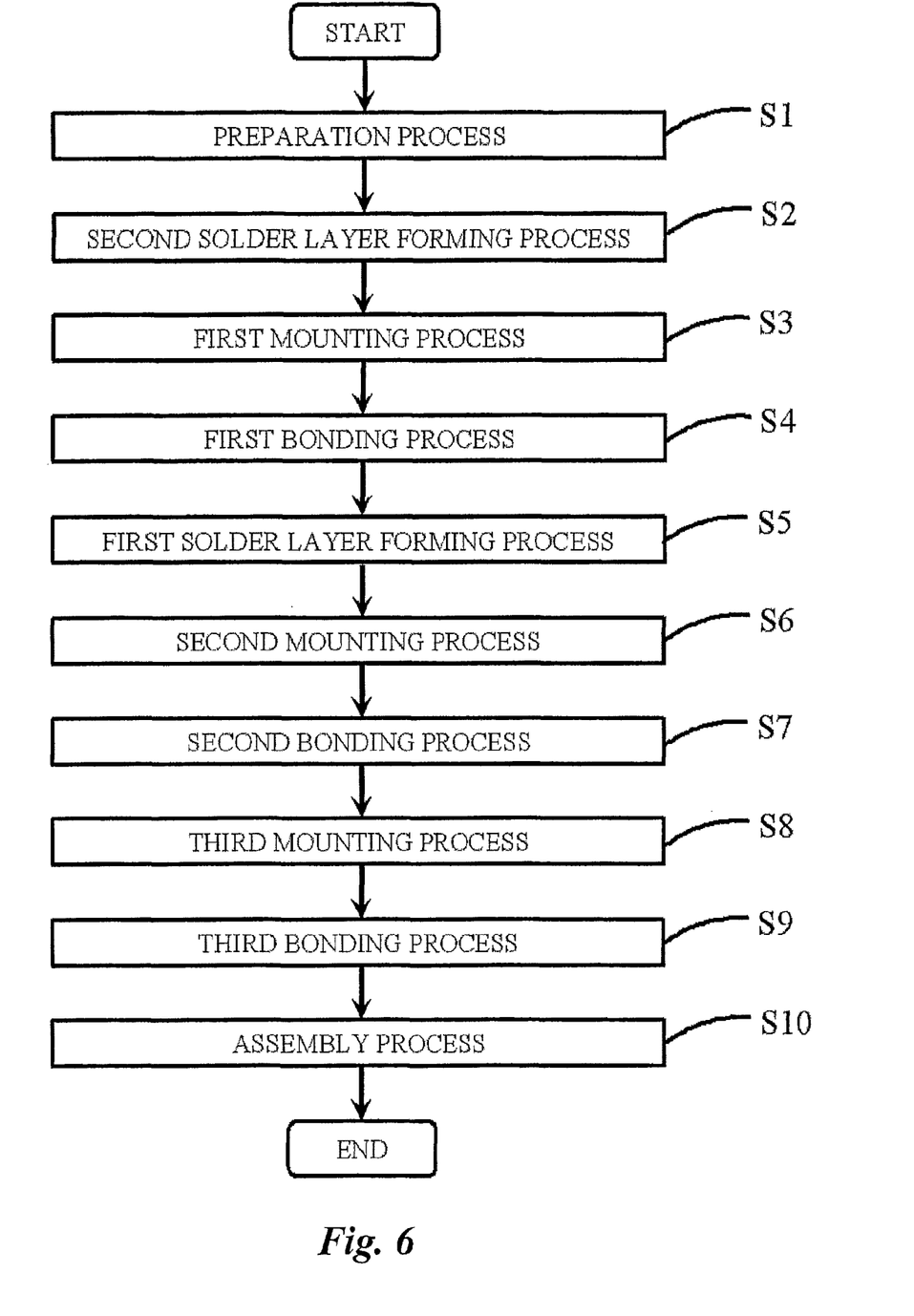
FIG. 6 illustrates a manufacturing method of the electronic component unit in FIG. 1.

In the manufacturing method of the electronic component unit 10, first, in step S1 (preparatory process) shown in FIG. 6, the circuit board 20, the heat transfer board 30 and the heat sink 40 are prepared. The first circuit pattern layer 21 is formed on the first board face 20*a* of the prepared circuit board 20, and the second circuit pattern layer 22 is formed on the second board face 20*b* thereof. When preparing the heat transfer board 30, the insulative layer 32 is formed on the first board face 31*a* of the board body 31, and the heat transfer metal foil layer 33 is formed on the insulative layer 32.

At step S2 (the second solder layer forming process) subsequent to the preparatory processes, the second solder layer 34 is formed by applying a cream solder to the board bonding second metal foil layer 22 or to the heat transfer metal foil layer 33. A cream solder printer is used to apply a cream solder to one of the metal foil layers 22, 33 to thereby form the second solder layer 34. The cream solder is a solder in a cream state prepared from particles of solder in solvent and flux.

At a step S3 (first mounting process) subsequent to the second solder layer forming process, the board bonding second metal foil layer 22 and the heat transfer metal foil layer 33 are superimposed on each other with the second solder layer 34 interposed therebetween. At the same time, the heat generating element 63 (see FIG. 5), such as a shunt resistor, is mounted to the board bonding second metal foil layer (second circuit pattern layer) 22 with the second solder layer 34 interposed therebetween.

At a step S4 (first bonding process) subsequent to the first mounting process, the board bonding second metal foil layer 22 and the heat transfer metal foil layer 33 are bonded by soldering by re-melting the second solder layer 34. For example, the circuit board 20 in a mounted state with the heat transfer metal foil layer 33 and the heat generating element (shunt resistor) 63 is placed in a reflow oven, heated, and then cooled (reflow process). As a result, the second solder layer 34 bonds both the metal foil layers 22, 33 to each other by re-melting and then solidifying. The board bonding second metal foil layer 22 is also bonded to the heat generating element (shunt resistor) 63 at the same time.

At a step S5 (first solder layer forming process) subsequent to the first bonding process, the circuit board 20 is inverted, and the first solder layer 26 is formed by applying a cream solder to the first circuit pattern layer 21. The first solder layer 26 is, similarly to the second solder layer 34, formed by printing (applying) a cream solder on the first circuit pattern layer 21 using a cream solder printer.

At a step S6 (second mounting process) subsequent to the first solder layer forming process, the heat generating elements 61 are mounted to the first circuit pattern layer 21 on the circuit board 20, with the first solder layer 26 interposed therebetween.

At a step S7 (second bonding process) subsequent to the second mounting process, the circuit board 20 is placed in a reflow oven with the heat generating elements 61 in an mounted state, heat is applied, and then cooling is performed (reflow process). As a result, the heat generating elements 61 are bonded to the first circuit pattern layer 21 by the first solder layer 26 re-melting and then solidifying.

At a step S8 (third mounting process) subsequent to the second bonding process, the other elements 62 are mounted by inserting the leads thereof into the lead attachment holes formed in the circuit board 20 through the first circuit pattern layer 21.

At a step S9 (third bonding process) subsequent to the third mounting process, the circuit board 20 is passed through a flow tank with the other elements 62 in a mounted state, and solder is applied. As a result, the other elements 62 are bonded to the first circuit pattern layer 21 on the circuit board 20 by soldering.

At a step S10 (assembly process) subsequent to the third bonding process, the second board face 31b of the heat transfer board 30 is superimposed on the heat sink 40, and the heat transfer board 30 and the circuit board 20 are assembled to the heat sink 40 with the fitting members 41. The heat sink 40 is then covered by the cover 50, thus completing manufacture of the electronic component unit 10.

Note that the execution sequence for executing steps S2 to S4 and for executing steps S5 to S7 may be swapped over.

In the manufacturing method of the electronic component unit 10 according to the first embodiment, the solder layer (second solder layer) 34 (is formed by applying a cream solder to one of the metal foil layers 22, 33, both the metal foil layers 22, 33 are superimposed on each other with the second solder layer 34 interposed therebetween, and by re-melting the second solder layer 34, the metal foil layers 22, 33 are bonded together by soldering. As a result, the heat transfer board 30 is integrated to the circuit board 20. Since the heat transfer metal foil layer 33 is formed on the first board face 31a of the heat transfer board 30 via the insulative layer 32, a separate component (such as an insulating sheet) for electrical insulation between the circuit board 20 and the heat transfer board 30 is not required. Consequently, while reducing the number of constituent elements, the number of assembly processes can also be reduced.

Next, the second board face 31b of the heat transfer board 30 is superimposed and assembled to the first face 40a of the heat sink 40. The heat transfer board 30 is thereby interposed between the circuit board 20 and the heat sink 40, and the three components 20, 30, 40 can thereby be assembled as a single unit. Accordingly, by simply interposing the heat transfer board 30 between the circuit board 20 and the heat sink 40 and bonding the circuit board 20 and the heat transfer board 30 together with solder, heat generated by the heat generating elements 61 can be efficiently externally dissipated.

Since both the heat generating elements 61 and the other electrical elements 62 can be mounted to the circuit board 20, wiring for connecting the heat generating elements 61 and the other elements 62 is not required. Consequently, while reducing the number of constituent elements, the number of assembly processes can also be reduced.

Second Embodiment

Figure 7:
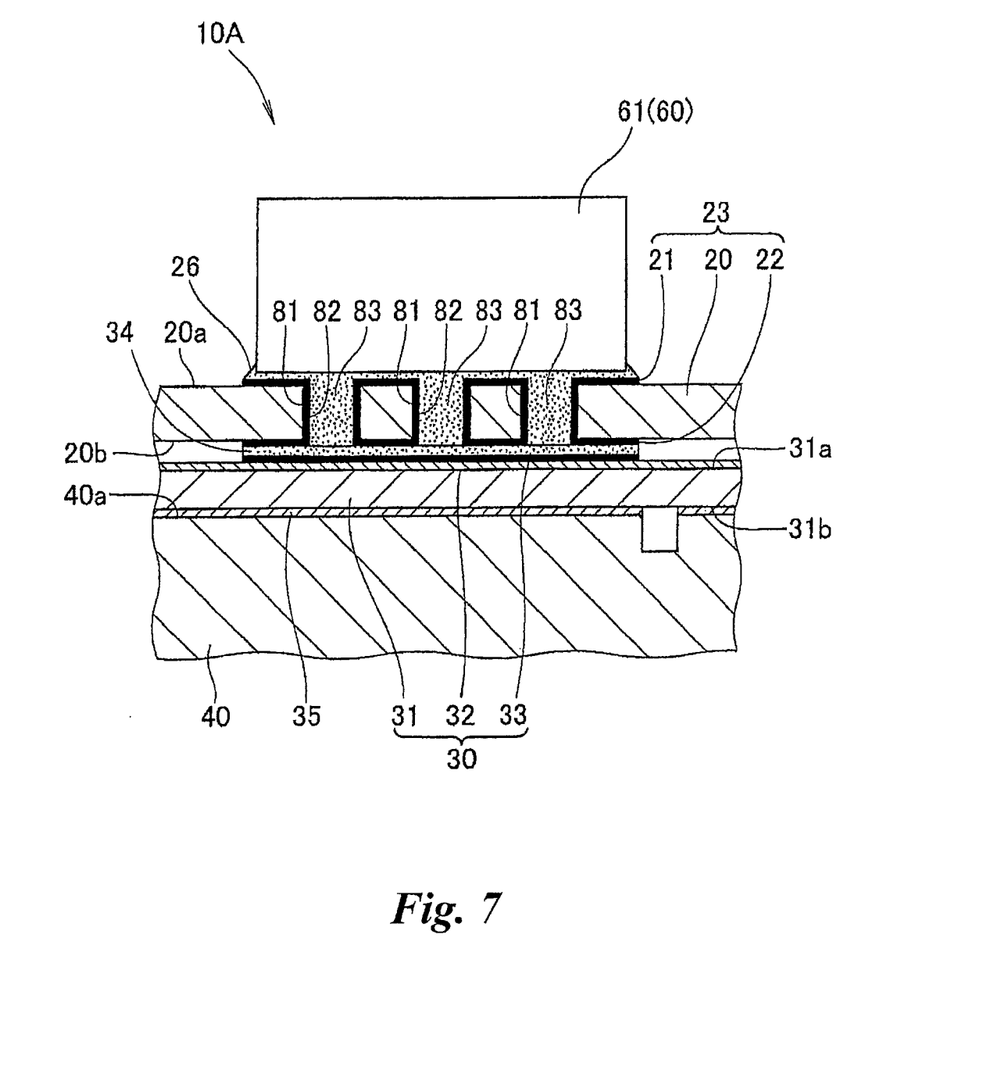
FIG. 7 cross-sectionally illustrates an electronic component unit according to a second Embodiment.

An electronic component unit according to a second Embodiment will be described. FIG. 7 cross-sectionally illustrates an electronic component unit 10A of the second Embodiment. In the second Embodiment, the electronic component unit 10 shown in FIG. 3 is modified into an electronic component unit 10A shown in FIG. 7. Since other parts of the configuration and the manufacturing method are similar to those shown in FIG. 1 to FIG. 6 further explanation is omitted.

Specifically, in the electronic component unit 10A of the second Embodiment, the circuit board 20 has at least one through hole 81 provided in a mounting area 24a (see FIG. 4B) for mounting a heat generating element 61. The through hole 81 passes through the circuit board 20 in the thickness direction. Ring shaped metal foil 82 is formed to electrically connect the wall faces of the through hole 81 to the first and second metal foil layers 21, 22. For example, the ring shaped metal foil 82 is formed together with the first and second metal foil layers 21, 22 by printing or electroplating the wall faces of the through hole 81. The ring shaped metal foil 82 is connected to the first and second metal foil layers 21, 22 such that the first and second metal foil layers 21, 22 are electrically connected to each other.

The heat transfer metal foil layer 33 is formed to the circuit board 20 as described above, with a similar pattern to the circuit pattern of the first and second metal foil layers 21, 22. The circuit patterns of the first and second metal foil layers 21, 22 are electrically connected to the pattern of the heat transfer metal foil layer 33 through the second solder layer 34. Current to be supplied to the heat generating elements 61 can thus flow through both the circuit pattern of the first and second metal foil layers 21, 22 and the circuit pattern of the heat transfer metal foil layer 33. Namely, the heat transfer metal foil layer 33 can be efficiently utilized.

Consequently, the electrical conducting capacity of the circuit pattern of the first metal foil layer 21 can be reduced. Accordingly, the thickness and/or width of the circuit pattern of the first metal foil layer 21 can be reduced by this amount.

The large capacity heat generating element 61 can be mounted to the circuit board 20, by supplying current to the heat generating element 61 from the circuit pattern of the first metal foil layer 21, from the circuit pattern of the second metal foil layer 22 and from the circuit pattern of the heat transfer metal foil layer 33.

Solder 83 (in-hole solder 83) is filled in the through hole 81. Specifically, the in-hole solder 83 is filled into the ring shaped metal foil 82. The in-hole solder 83 is connected to the first and second metal foil layers 21, 22 and the first and second solder layers 26, 34, such that the in-hole solder 83 electrically connects these together.

Heat generated by the heat generating elements 61 is transferred with good efficiency to the heat transfer board 30 through the solder (in-hole solder) filled in the through hole 81, and then transferred onward to the heat sink 40. Consequently, the heat dissipation ability can be increased further.

The electronic component unit 10A of the second Embodiment has similar operation and effect to that of the electronic component unit 10 of the first Embodiment.

Third Embodiment

Figure 8:
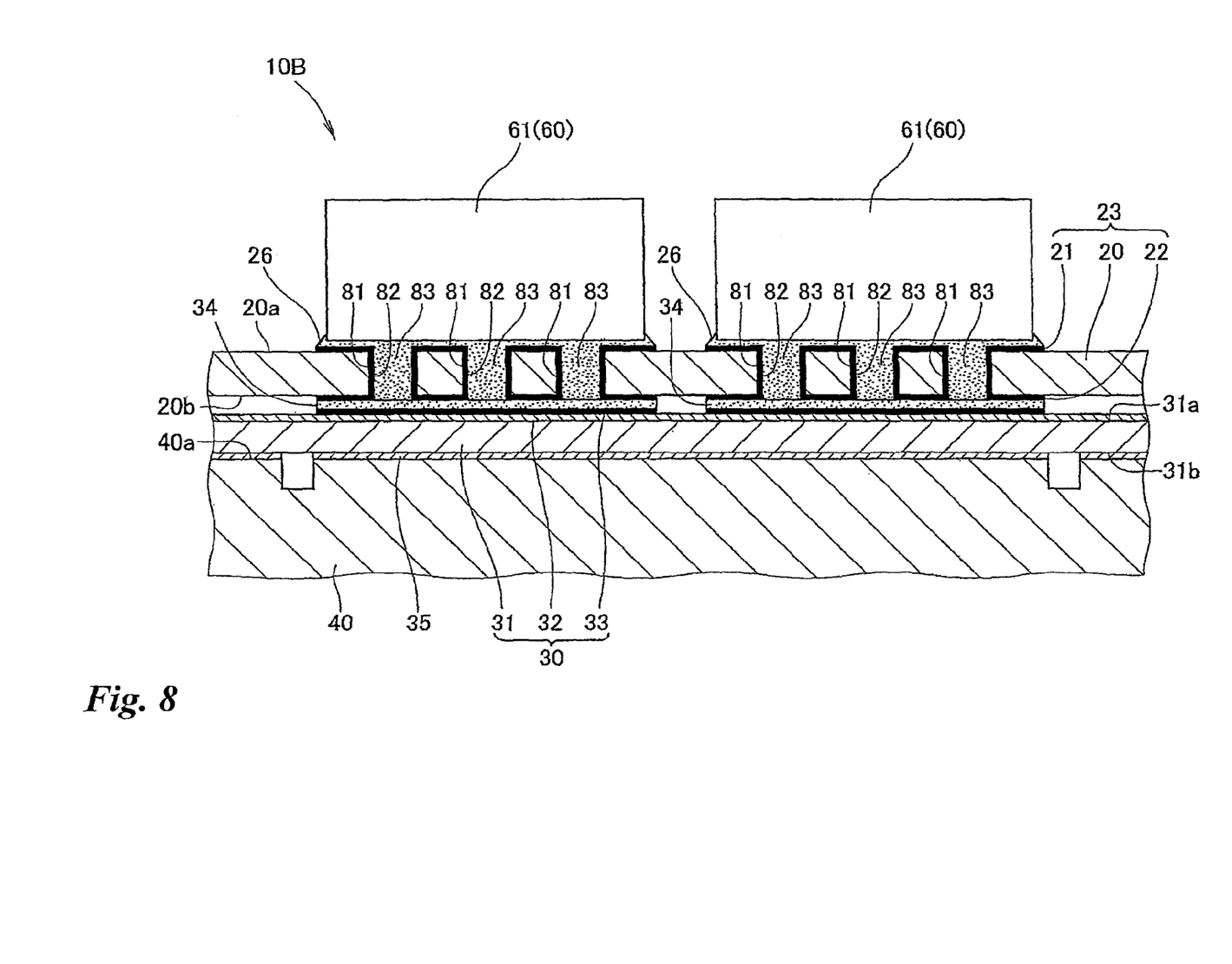
FIG. 8 cross-sectionally illustrates an electronic component unit according to a third Embodiment.

An electronic component unit of a third Embodiment will be described. FIG. 8 cross-sectionally illustrates an electronic component unit 10B of the third Embodiment. In the third Embodiment, the electronic component unit 10A of the second Embodiment shown in FIG. 7 is modified into the electronic component unit 10B shown in FIG. 8. Since other parts of the configuration and the manufacturing method are similar to those shown in FIG. 1 to FIG. 6 further explanation is omitted.

In FIG. 8, plural heat generating elements 61, 61 are mounted to the circuit board 20, with the circuit pattern of the first metal foil layer 21, the circuit pattern of the second metal foil layer 22 and the circuit pattern of the heat transfer metal foil layer 33 separately corresponded to each of the heat generating elements 61, 61. There is at least one through hole 81 in the circuit board 20 for each of the respective heat generating elements 61, 61. Accordingly, the through holes 81 corresponding to each of the respective heat generating elements 61, 61 are electrically isolated from each other.

The electronic component unit 10B of the third Embodiment has similar operation and effect to the electronic component unit 10 of the first Embodiment.

Figure 9:
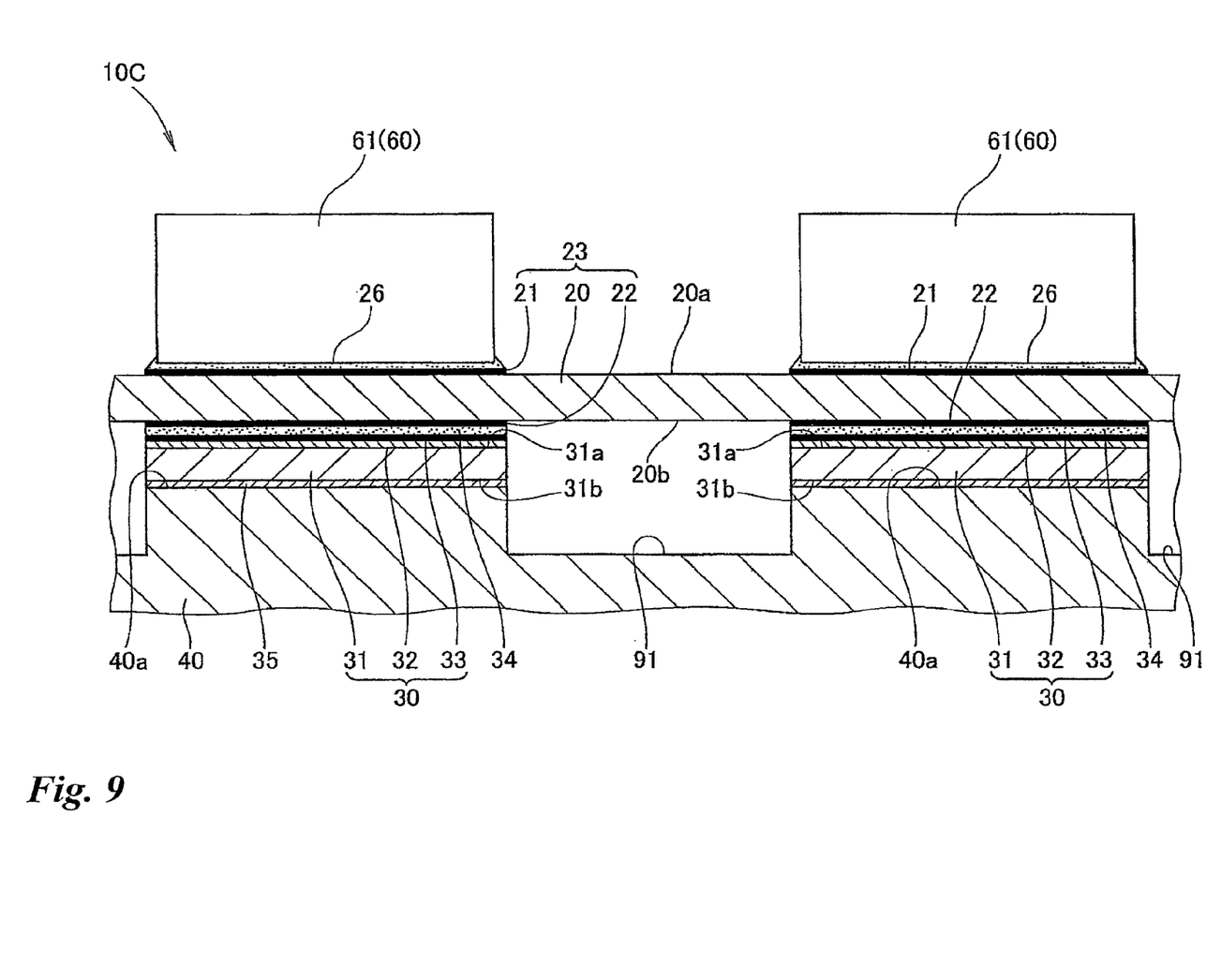
FIG. 9 cross-sectionally illustrates an electronic component unit according to a fourth Embodiment.

An electronic component unit according to a fourth Embodiment will be described. FIG. 9 cross-sectionally illustrates an electronic component unit 10C of the fourth Embodiment. In the fourth Embodiment, the electronic component unit 10 of the first Embodiment shown in FIG. 1 and FIG. 3 is modified into the electronic component unit 10C shown in FIG. 9. Since other parts of the configuration and the manufacturing method are similar to those shown in FIG. 1 to FIG. 6 further explanation is omitted.

On the circuit board 20, plural mounting areas 24a (see FIG. 4B) are provided for mounting plural heat generating elements 61. The heat transfer board 30 is partitioned so as to correspond to each of the plural respective mounting areas 24a. Namely, the plural heat transfer boards 30 need only be small in size, so as to match the size of the corresponding respective mounting areas 24a. Depressions 91 are formed in the first face 40a of the heat sink 40, except in the locations superimposed by the respective heat transfer boards 30. Accordingly, efficient heat dissipation effect is obtained while minimizing the use of the relatively high cost heat transfer boards 30.

The electronic component unit 10C of the fourth Embodiment has similar operation and effect to the electronic component unit 10 of the first Embodiment.

The embodiments described herein are not limited to a double sided board circuit board 20 having the metal foil layers 21, 22 on both faces, and a single sided board having the second metal foil layer 22 only on the second board face 20b side may be used. In this case, the electrical components 60 including the heat generating element 61 may be mounted to the second metal foil layer 22.

For example, the electronic component units and manufacturing methods of the embodiments exemplified herein are applied for external dissipation of heat generated by heat generating elements, such as semiconductor switching elements for controlling drive current of a motor in a vehicle electrically driven power steering apparatus and power elements for audio applications.

What is claimed is:

1. An electronic component unit manufacturing method, comprising:
   preparing:
      a circuit board including a heat generating element mounted thereon and a bonding metal foil layer formed thereon;
      a heat transfer board including an insulative layer formed on one face thereof and a heat transfer metal foil layer formed on the insulative layer; and
      a heat sink;
   applying a cream solder to form a solder layer on the board bonding metal foil layer or the heat transfer metal foil layer;
   superimposing the bonding metal foil layer and the heat transfer metal foil layer with each other via the solder layer;
   re-melting the solder layer to solder the bonding metal foil layer and the heat transfer metal foil layer; and
   superimposing the other face of the heat transfer board with the heat sink to thereby assemble the circuit board with the heat sink via the heat transfer board.

2. The electronic component unit manufacturing method according to claim 1, wherein the insulative layer is an electrically insulating thin film that is thermally conductive.

3. The electronic component unit manufacturing method according to claim 2, wherein the insulative layer is about 50 µm to about 200 µm thick.

4. The electronic component unit manufacturing method according to claim 2, wherein the insulative layer is made of epoxy resin.

5. The electronic component unit manufacturing method according to claim 2, wherein during the re-melting, the heat transfer metal foil layer is between the insulative layer and the bonding metal foil.

6. The electronic component unit manufacturing method according to claim 1, further comprising:
   providing another solder layer between the heat generating element and the circuit board; and
   heating the another solder layer to reflow the another solder layer, thereby bonding the heat generating element to the circuit board via the another solder layer.

7. The electronic component unit manufacturing method according to claim 6, wherein the circuit board has a circuit pattern to which the heat generating element is mounted via the another solder layer.

8. The electronic component unit manufacturing method according to claim 7, wherein the circuit board is between the heat generating element and the bonding metal layer.

9. The electronic component unit manufacturing method according to claim 5, wherein the circuit board is between the heat generating element and the bonding metal layer.

* * * * *